United States Patent [19]

Bauser et al.

[11] Patent Number: 4,495,232

[45] Date of Patent: Jan. 22, 1985

[54] STAMPING FOILS AND METHODS

[75] Inventors: Herbert Bauser, Stuttgart; Edmund Kurz, Magstadt; Bernd Schindler, Stuttgart; Klaus Zerweck, Leonberg; Thomas Bolch, Heilbronn; Andreas Haller, Villingen-Schwenningen; Theo Mager, Bad Dürrheim, all of Fed. Rep. of Germany

[73] Assignee: Irion & Vosseler GmbH & Co. & Zahlerfabrik, Schwenningen, Fed. Rep. of Germany

[21] Appl. No.: 363,068

[22] Filed: Mar. 29, 1982

[30] Foreign Application Priority Data

Apr. 22, 1981 [DE] Fed. Rep. of Germany ....... 3116078

[51] Int. Cl.$^3$ ............................. B32B 7/10; C09J 7/02
[52] U.S. Cl. ...................................... 428/41; 156/230; 156/233; 427/96; 428/42; 428/215; 428/323; 428/332; 428/346; 428/347; 428/457; 428/901; 428/913; 428/914
[58] Field of Search ............... 428/901, 346, 913, 343, 428/41, 349, 332, 457, 914, 42, 215, 323, 347; 156/230, 233; 427/96

[56] References Cited

U.S. PATENT DOCUMENTS 3,753,850  8/1973  Brunet ............................ 156/233 X
4,012,552  3/1977  Watts ............................. 156/233 X Primary Examiner—Thomas J. Herbert
Attorney, Agent, or Firm—McAulay, Fields, Fisher, Goldstein & Nissen

[57] ABSTRACT

A stamping foil for forming printed circuit patterns on insulating or poorly conductive substrates comprising an electrically conductive layer made of a highly conductive metal, such as copper, which is endowed with a sufficiently low shear strength, even in thicknesses of 10 microns or more, to permit easy and sharp separation of the activated (imprinted) and non-activated portions of the foil. Such a low shear strength may be achieved with fibrous or fibrous-granular crystallite structures, wherein the fibers are oriented approximately at right angles to the surfaces of the foil, and, in addition, by doping agents containing carbon, nitrogen and sulfur. The foil may comprise a bonding layer for bonding the conductive layer to a substrate, or such a bonding layer may be applied to the surface of the conductive layer before the stamping operation. The conductive layer may be either self-supporting, or it may adhere to a carrier tape through an intermediary separating layer. In the latter case, the bonding and separating layers become activated when compressed by a stamping die or stereotype, whereby the conductive layer becomes bonded to the substrate and separated from the carrier tape in the activated areas. The activated and non-activated portions of the foil are then separable by pulling the carrier tape away from the substrate.

23 Claims, 5 Drawing Figures

STAMPING FOILS AND METHODS

BACKGROUND OF THE INVENTION

This invention pertains to stamping foils and methods for producing electrically conductive paths on nonconductive or poorly conductive substrates.

Electrical and electronic circuits are made often of printed wiring or foil on insulating boards. Their usual manufacturing processes expend materials and labor and require complicated equipment. On substrates coated with copper (subtractive technique or metallizing technique) or with a bonding agent containing a sensitizer (additive or semi-additive technique) the conductive patterns are brought out by screen printing or photoprinting, and the printed circuit boards are etched, depending on the process used, after an initial strike of copper by chemical displacement or plating followed by electrodeposition of copper or tin. Between these main procedural steps are other necessary steps, such as cleaning, removal of the mask, drying, checking, etc. Whereas all other parts of switching or measuring instruments, such as housings, mechanically movable parts, mechanical supports or connections, can be produced by methods which are capable of a high output per unit time (e.g., pressure diecasting, stamping, drawing, etc.), the production of printed circuit boards by wet chemical means consumes a disproportionately high amount of time and work.

It is an object of this invention to provide a simple and economical method of producing printed circuit boards which is capable of a high output per unit time.

Various-dry processes have been proposed to lay down printed circuits from a material in a roll directly upon the substrates. These processes may be classed into the following three categories.

The first category includes punching the printed circuit pattern out of a self-supporting conductive foil which is laid down on a substrate, and simultaneously bonding the pattern to the substrate. The common disadvantages of this procedure are: a relatively costly punching and blanking tool, the difficult or troublesome removal of the residual foil (i.e., the portion not used as a conductive circuit) from the substrate, especially where the conductive circuits have the form of almost closed loops, and difficulties in producing very narrow conductive patterns with tight spacings in between them.

The second category comprises processes in which conductive patterns prepared by previously mentioned wet chemical methods are placed on a carrier tape and are transferred therefrom onto the substrates. The disadvantage here is that the preparation of the conductive patterns requires the aforementioned expensive wet chemical steps. Furthermore, the conductive patterns may get distorted during their transfer to and from the carrier tape.

In the third category, the conductive patterns are cut out of a copper foil placed on a carrier tape, and are thereafter transferred from the tape onto the substrates. Once the copper foil is affixed to a substrate, the carrier tape is pulled off. The problem here is with the troublesome and not very precise cutting step.

It is a second object of this invention to provide a dry process for producing printed circuit boards which is capable of producing fine and intricate circuit patterns to the required precision and which is free from the other above-cited shortcomings of the existing dry processes.

Besides the above-mentioned processes for producing printed circuits, there is also the hot-stamping process which is capable of forming thin films of conductive materials in nearly any desired pattern but which could not be used heretofore for the production of printed circuits. The layers which can be stamped out in various patterns from conventional hot-stamping foils have maximum thicknesses of about 100 millimicrons, which is too thin for printed circuits by about two orders of magnitude. The small thickness of the conductive layer (e.g. of copper) results not only in an irreproducible value of the electrical resistance due to variations in quality and to diffusion of bonding agents into the layer. A further disadvantage of metallic layers deposited from conventional hot-stamping foils is that they cannot be satisfactorily tinned or soldered due partly to their thinness and partly to a poorly solderable surface. Enhancement of the stamped conductive patterns by electroplating would not only nullify the advantage of a quick uncomplicated production method, but would also involve electroplating of pieces with poor contacts, etc. The plating bath would also get contaminated with bonding material which to some extent would diffuse into the very thin conductive layer, and the plating uniformity would therefore by unsatisfactory due to the irreproducible and non-uniform electrical resistance distribution. Finally there would arise bonding problems and durability problems.

The hot stamping process would otherwise offer considerable advantages, were it suitable for conductive patterns of the required thickness. In distinction from the afore-cited dry processes, the bonding of the conductive patterns onto the substrate and the removal of the residual foil could be accomplished in a single operation, and the required stamping would be relatively inexpensive (cheaper than a punching press). In contrast to that class of stamping processes which might as well be designated as "punching" or "blanking," hot-stamping and cold-stamping as used in this invention does not involve a blanking tool. Therefore, the residual foil can easily be removed by a carrier type as will be described below. The hot-stamping process permits, in principle, to print patterns on either flat or curved parts. It is thus possible to print numbers on the plastic counting wheels of counter registers. The main advantages of the dry processes over the aforementioned wet chemical techniques stand out with hot-stamping. Besides overcoming the already mentioned problems encountered with existing processes for printed circuit production, hot-stamping would also eliminate another disadvantage, namely the need to use separate plates for wiring and switching, even though there is frequently enough room for both on certain existing insulating parts, e.g., on housing or receptacle parts. Furthermore, a circuit plate in an instrument could frequently be made smaller, more compact, and more flexible, were it possible to resort to more complexly curved substrate plates than are compatible with present techniques.

It is therefore a further object of this invention to provide stamping foils and methods with which conductive paths can be produced in the form of printed circuits or printed wiring on insulating or poorly conductive substrates. The latter may be already mechanically functioning parts (e.g., of a housing, support, and the like) in instruments (e.g., switching, regulating or measuring instruments) or may be specially made in a compact structurally appropriate form.

SUMMARY OF THE INVENTION

Briefly this invention accomplishes the aforeoutlined objectives by resorting to a stamping foil comprising a functional layer, usually electrically conductive, of adequate thickness (e.g. 8 to 35 microns) out of which any desired patterns may be printed by a hot- or cold-stamping method.

The resulting printed conductors can be soldered or tinned by hand or by machine, and they have an adequate and reproducible electrical conductance. The stamping foil comprises a bonding layer and an electrically conductive layer, and possibly also a separating layer and a carrier tape. The bonding and separating layers get activated by compression, and, with the hot-stamping method, by heat whereby the conductive layer gets bonded to the substrate and separated from the carrier tape in the activated areas. To allow sharp separation of the latter areas from the rest of the foil, the functional (i.e., usually conductive) layer is grown in form of fibrils (or mixed granules and fibrils) whose axes are oriented at nearly right angles to the surfaces of the foil so as to endow this layer with a very low shear strength. In addition, this layer may contain dopants serving the same purpose.

BRIEF DESCRIPTION OF THE DRAWINGS

The invention is best understood with the aid of the drawings in which.

DESCRIPTION OF THE PREFERRED EMBODIMENTS

Figure 1:
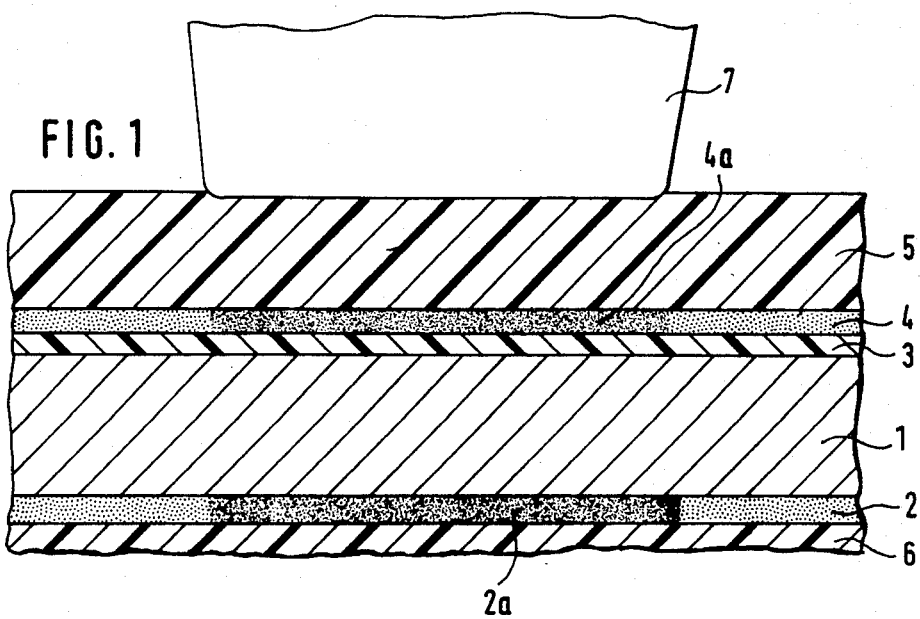
FIG. 1 is a schematic cross-sectional diagram of a hot-stamping foil according to one embodiment of the invention prior to the stamping operation.

In the embodiment of the invention shown in FIG. 1, the hot-stamping foil resembles those used heretofore except for the relative dimensions. The letter foils comprise several layers:

(a) the functional layer 1 (e.g., around 50 millimicrons thick in the hot-stamping foils used heretofore) which has generally a decorative or graphic function, however, being of thin metal, it can also be somewhat conductive electrically but not conductive enought for printed circuit applications;

(b) one or more strata of a melting glue 2 (e.g., 3 microns thick);

(c) a protective layer 3 (e.g., 1.5 microns thick);

(d) a separating layer 4 (e.g., around 100 millimicrons thick); and (e) a carrier tape 5 (e.g., of polyester about 12 microns thick).

In contradistinction from the heretofore used dimensions, the functional layer layer of FIG. 1 is extraordinarily thick as compared with the carrier tape 5. However, the thickness ratio of FIG. 1 for these two layers is quite appropriate for the below-described hot-stamping foil according to this invention.

Figure 2:
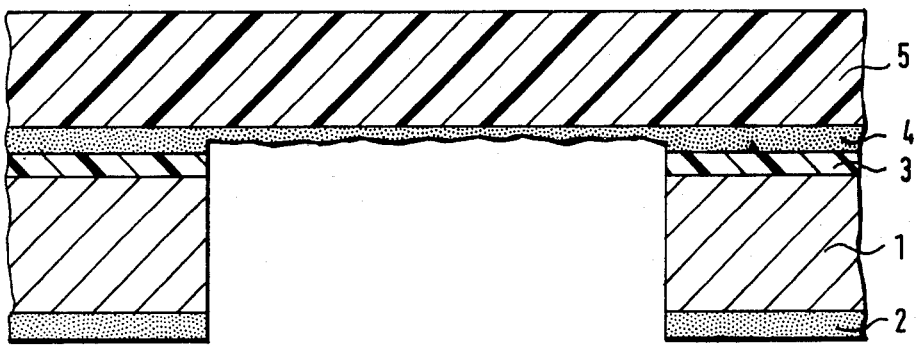
FIG. 2 is a schematic cross-sectional diagram of the same foil immediately after stamping and separation of the activated (compressed) and unactivated portions of the foil.
Figure 2:
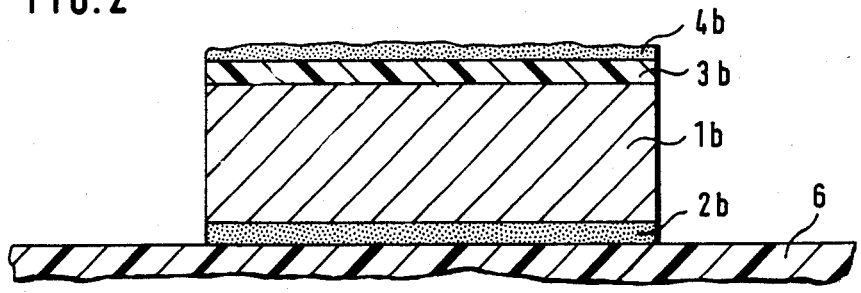

To form a printed pattern the hot-stamping foil is laid down as a tape on a substrate 6 in accordance with FIG. 1, and is pressed against the substrate by means of a stereotype 7 affixed to a heated stamping die. In the areas of the foil subjected to the heat and compression by the stereotype, a component 2a of the melting glue 2 becomes activated and causes the functional layer 1 to be bonded to the substrate in accordance with the stereotype pattern, while a component 4a of the separating layer 4 is activated so as to permit separation of the functional layer 1 with his protective layer 3 from the carrier type 5. Therefore, after lifting the stereotype 7 and carrier tape 5 together with the residual unactivated part of the hot-stamping foil from the support 6, the previously compressed area 1b of the functional layer 1 together with portion 3b of the protective layer 3 and any residue 4b from the separating layer 4 remain firmly attached by the solidified component 2b of the melting glue to the substrate 6, as indicated in FIG. 2. There is no pattern punched out of the carrier foil as would happen with the punching or blanking process (often also called stamping).

If the functional layer 1 of such a hot-stamping foil consisted of the usual copper foil, e.g., 10 microns thick, as would be necessary and sufficient for many printed circuit applications, then no conductive patterns could be produced by this method, because it would not be possible to obtain a sharp separation of the conductive paths in accordance with the stereotype pattern, as the copper foil would adhere irregularly and partly to the substrate and partly to the carrier tape or else entirely to either one of these.

According to the present invention, the functional layer 1 of the stamping foil consists of a material whose structure and composition endow it with a shear strength so low as to permit stamping of conductive paths or even integrated electrical components of a thickness similar to that in conventional printed circuit plates (e.g., 10 to 35 microns) and thereafter obtain a sharp separation of the residual (not compressed) parts of the conductive layer upon pulling away the carrier tape. For instance, the functional layer 1 may consist of a copper foil having a shear strength of between 10 to 50 N/mm$^2$ with sufficient ductility for the production of the foil in the form of a roll.

Another feature of the stamping foil of the present invention is easy solderability and tinning of the functional layer 1 (made of copper, for instance)—whether by hand or machine using conventional or specially selected types of soldering tin alloys—without removal of the conductors from the substrate, without bubble formation, and without wetting problems. In spite of its exceptionally easy shearability, the functional layer 1 of the present invention has adequate electrical conductivity. For instance, a functional layer made of copper has a conductivity of 25 to 45 m/ohm-mm$^2$, which is only somewhat lower than that of electrolytic copper (57 m/Ohm-mm$^2$).

Figure 4:
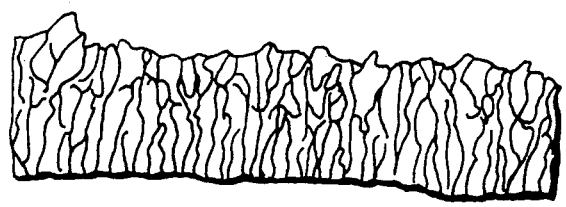
FIG. 4 is an enlarged cross-sectional diagrammatic representation of the fibrous structure of a functional layer 1 of FIGS. 1, 2, and 3.
Figure 5:
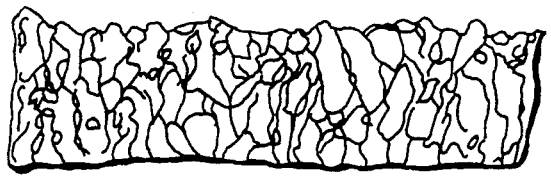
FIG. 5 is a similar representation of an alternative mixed fibrous-granular structure of the same layer 1.

This functional layer has a crystallite structure which may be describe in idealized simplified terms as fibrous or fibrous-granular, wherein the fibrils are oriented nearly at right angles to the surfaces of the layer. Such crystalline structures are illustrated in FIGS. 4 and 5. The fibers may have diameters of, e.g., 0.5 to 2 microns.

In the copper samples used for the layer 1 of the present invention traces were found of carbon, nitrogen, and sulfur.

Should the printed circuit consist not only of simple conductive paths of the printed wiring type, but require printed patterns of different metals next to copper conductors, then it is possible to use two or more stamping foils, each comprising the appropriate metal in its functional layer 1, and each being subjected to the same stamping procedure with its appropriate stereotype.

Figure 3:
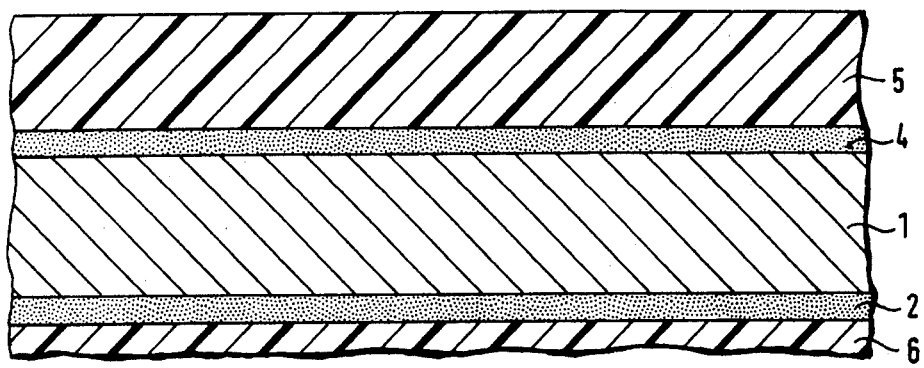
FIG. 3 is a schematic cross-sectional diagram of a hot-stamping foil according to another embodiment of the invention.

The basic layer structure of the stamping foil of this invention is very similar to that of known hot-stamping foils, as illustrated in FIGS. 1 and 2. The functional layer 1 is usually covered with a protective layer 3 (FIG. 1). In one embodiment of this invention, said layer 3 comprises a soldering flux, e.g., in form of a soldering varnish. In another embodiment, as shown in FIG. 3, the soldering flux is contained in the separating layer 4, so that the protective layer 3 may be dispensed with. In this case, the layer 4, or if it is composite, its first layer next to layer 1 contains a soldering flux, such as a mixture of terpenes.

In one embodiment of the invention, the separating layer 4 comprises a melting glue which differs from that in the below-discussed bonding layer 2. The freezing point of the melting glue of layer 4 is below that of the bonding layer 2, and its rate of solidification is much lower (e.g., ten times slower) than that of the bonding layer. Typical values are:

| Melting Glue in | Freezing Point (°C.) | Freezing Rate ($s^{-1}$) |
| --- | --- | --- |
| Layer 4 | 100 | 1 |
| Layer 2 | 180 | 10 |

In one embodiment, the glue of layer 4 consists of a mixture of at least three components—firstly an elastomer, secondly a thermoplastic material, and thirdly a mixture of long-chain organic acids or esters or a mixture of terpenes or a combination of both mixtures.

In a further embodiment of the invention, the separating layer 4 comprises a substance or a mixture of substances which effect good bonding between the functional layer 1 and the carrier tape 5 up to a certain limiting temperature which is markedly (e.g., around 50° C.) below the hot-stamping temperature, but which is or are chemically transformed when said limiting temperature is exceeded, so as to permanently lose its or their bonding characteristics. This substance or mixture of substances may be of the type wherein the chemical transformation is accompanied by gas evolution, whereby the desired separation of the functional layer 1 from the carrier tape 5 is facilitated in the heated portions of the foil after hot-stamping.

In yet another embodiment of the stamping foil of this invention, the separating layer 4 comprises a glue whose bonding power is removed or weakened by the introduction of a solvent in the stamping step. For instance, this solvent may be contained in microcapsules contained within layer 4 and squeezed out of the capsules at the stamping temperature and pressure.

In a particular embodiment, the solvent is liberated from the microcapsules upon compression of the stamping die without application of heat. In this embodiment, the bonding layer 2 is also activated by compression alone. For instance, it may comprise a non-bonding or insufficiently bonding substance in which microcapsules are also embedded. These microcapsules contain a fluid, e.g., a solvent, which is liberated under the stamping pressure and activates layer 2 so as to endow it with bonding power. This embodiment may be defined as a cold-stamping foil.

In a still further embodiment, microcapsules are embedded in the substance of layer 4 which contain a reagent which, after release on compression, reacts with said substance and causes a chemical transformation theren, hereby the bonding between the functional layer 1 and the carrier tape is destroyed or weakened to such an extend that layer 1 adheres more firmly to substrate 6 than to carrier tape 5. The desired effect may be enhanced by a combination of different types of microcapsules (i.e., containing a solvent and/or a reagent) in layer 4.

The carrier tape 5 may be made either out of a sheet of regenerated cellulose, e.g., ethyl cellulose, or in a conventional manner out of a sheet of synthetic material, e.g. from polyethyleneterephthalate, or another polyster, which can be bonded to layer 1 after the latter is coated or after being first coated with layer 4.

Either before or after the bonding of tape 5 with layer 1, the latter is covered with one or several coats of the bonding layer 2, which comprises one or more melting glues. For the embodiment of the invention in which layer 4 also comprises a melting glue, the differences between the properties of the glues of layers 2 and 4 were already specified above. The melting glues are usually not conductive electrically.

As already indicated, the bonding layer 2 in one embodiment of the invention consists of a non-bonding or insufficiently bonding substance in which microcapusles are embedded. These microcapsules contain a fluid which, upon release in the stamping operation (effect of compression alone or compression and temperature), activates said substance, thereby turning layer 2 into glue. This activating fluid may be either a solvent or a reagent combining with said substance as in commonly known two-component adhesives.

The functional layer 1 may comprise traces of carbon, nitrogen or sulfur.

In a further embodiment, the bonding layer 2 comprises a reagent which, when compressed, reacts chemically with the substrate 6 and with the functional layer 1 so as to effect a strong bond between them. In a particular embodiment, this reagent is applied to the copper layer as the stamping foil is introduced into the stamping apparatus.

The coating of the functional layer 1 with the separating layer 4 and with the bonding layer 2 or, alternatively, the coating of the carrier tape 5 with the separating layer 4 is accomplished by known coating procedures such as spraying, casting, extrusion-coating, smearing, dipping, and the like. A simplified embodiment of the stamping foil of this invention can be produced by covering the functional layer 1 with one or more coats of a melting glue, while dispensing with the carrier tape 5, the separating layer 4, and possibly also the protective layer 3. In this case, the functional layer 1 is self-supporting. It is thus possible to print good conductive circuits, e.g., of copper. However, due to the absence of the carrier tape, complex patterns require removal of the unstamped portions by wiping or brushing. Sharp separation of the stamped from the unstamped portions of the functional layer is achieved by lifting and/or wiping or brushing away the unstamped portions of the functional layer 1.

In the stamping foil of this invention, diverse electrically or electronically active materials may be used for the functional layer 1, so that the patterns may be printed performing various electrical functions, such as metallic conductive circuits of copper, silver, and the like, resistive paths made from other metals or metal oxides, semiconductive elements, photoconductors or photodiodes (usable, for instance, in light meters), etc.

There will now be obvious to those skilled in the art many modifications or variations of the afore-described embodiments, which shall remain within the scope of this invention if definable by the following claims.

We claim:

1. A stamping foil for producing electrically conductive circuits on an electrically insulating or poorly conductive substrate;

said foil being bondable to said substrate in areas activated by compression with a stamping die or stereotype and comprising an electrically conductive layer having a generally decorative or graphic function and having a thickness of between 10 to 35 microns to achieve the required electrical function(s);

said foil being endowed with sufficiently low shear strength to permit sharp separation of said activated areas from unactivated areas of the foil following a stamping operation;

said structure of said conductive layer consisting essentially of fibrous, fibrous-granular or fibrils whose axes are oriented at approximately right angles to the surfaces of said foil and having a diameter between 0.5 and 2 microns; and a bonding layer adjacent to said conductive layer;

said bonding layer being activatable by compression or heating with said stamping die or stereotype;

whereby said bonding layer effects adhesion of said conductive layer to said substrate in the activated areas.

2. The foil of claim 1, wherein said fibrils have diameters in the range between 0.5 microns and 2 microns.

3. The foil of claim 1, wherein said conductive layer comprises copper having a conductivity of at least 25 m/Ohm-mm$^2$.

4. The foil of claim 1 wherein said conductive layer comprises traces of a material selected from the group consisting of carbon, nitrogen and sulfur.

5. The foil of claim 1, wherein the bonding layer comprises a substance which is convertible into a glue upon being brought in contact with a suitable solvent or chemical reagent;

said solvent or reagent being contained in microcapsules embedded within the bonding layer; and being releasable from said microcapsules upon compression or heating with a stamping die or stereotype.

6. The foil of claim 1, wherein said bonding layer comprises a substance which reacts chemically with said substrate and said conductive layer upon application of pressure or heat, thereby effecting adhesion between the conductive layer and the substrate in the activated areas.

7. The foil of claim 1, wherein said bonding layer comprises a melting glue which rapidly solidifies and bonds said conductive layer to said substrate in the activated areas immediately following a hot-stamping operation.

8. The foil of claim 1 or 7, wherein the side of said conductive layer which is not in contact with said bonding layer is attached to a carrier tape by means of a separating layer which has sufficient adhesiveness to bond said tape to said conductive layer prior to stamping and which loses its adhesiveness in areas activated by a stamping operation.

9. The foil of claim 8, wherein said separating layer comprises a melting glue whose freezing point is substantially below the freezing point of the glue in the bonding layer and whose freezing rate is much slower than that of the glue in the bonding layer.

10. The foil of claim 8, wherein said separating layer comprises an elastomer, a thermoplastic material, and a long-chain organic acid.

11. The foil of claim 8, wherein the glue of said separating layer permanently loses its adhesive properties above a certain limiting temperature which is substantially below the hot-stamping temperature of the apparatus in which said foil is to be stamped.

12. The foil of claim 11, wherein said limiting temperature is at least 50° C. below said hot-stamping temperature.

13. The foil of claim 11, wherein the glue of said separating layer undergoes a chemical transformation above said limiting temperature.

14. The foil of claim 13, wherein said chemical transformation is accompanied by evolution of a gas.

15. The foil of claim 8, wherein the adhesiveness of said separating layer is destroyed or weakened upon introduction of a solvent or chemical reagent in the areas activated by the stamping operation.

16. The foil or claim 15, wherein said solvent or chemical reagent is contained in microcapsules which are embedded in said separating layer and is released from said microcapsules by application of pressure or heat during the stamping operation.

17. The foil of claim 8, wherein said carrier tape comprises a synthetic material.

18. The foil of claim 17, wherein said synthetic material is a polyester, e.g. polyethyleneterephtalate.

19. The foil of claim 8, wherein said carrier tape comprises a regenerated cellulose.

20. The foil of claim 19, wherein said regenerated cellulose is an ethyl cellulose.

21. The foil of claim 1 wherein the surface of said conductive layer facing away from said bonding layer is covered with a layer comprising a soldering flux.

22. The foil of claim 21 wherein said soldering flux comprises a mixture of terpenes.

23. The foil of claim 21, wherein said flux is applied in form of a soldering varnish.

* * * * *